(12) United States Patent
Jiang

(10) Patent No.: US 7,571,340 B2
(45) Date of Patent: Aug. 4, 2009

(54) ELIMINATING RECEIVER CLOCK DRIFT CAUSED BY VOLTAGE AND TEMPERATURE CHANGE IN A HIGH-SPEED I/O SYSTEM THAT USES A FORWARDED CLOCK

(75) Inventor: Yueming Jiang, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 504 days.

(21) Appl. No.: 11/452,478

(22) Filed: Jun. 13, 2006

(65) Prior Publication Data

US 2007/0286320 A1    Dec. 13, 2007

(51) Int. Cl.
*G06F 1/04* (2006.01)
(52) U.S. Cl. ..................... 713/500; 713/503
(58) Field of Classification Search ............... 713/500, 713/503
See application file for complete search history.

(56) References Cited

U.S. PATENT DOCUMENTS

| | | | |
|---|---|---|---|
| 4,694,472 A * | 9/1987 | Torok et al. ................. 375/354 |
| 6,038,254 A * | 3/2000 | Ferraiolo et al. ............. 375/232 |
| 6,285,864 B1 * | 9/2001 | Ruemmer et al. ............ 455/265 |
| 6,611,475 B2 * | 8/2003 | Lin ......................... 365/189.05 |
| 6,759,882 B2 * | 7/2004 | Lin ............................... 327/155 |
| 6,978,403 B2 * | 12/2005 | Takei et al. ................... 714/700 |
| 7,072,432 B2 * | 7/2006 | Belcea ......................... 375/356 |
| 7,168,027 B2 * | 1/2007 | Lee et al. ..................... 714/775 |
| 7,400,671 B2 * | 7/2008 | Hampel et al. ............... 375/219 |
| 2003/0217301 A1 * | 11/2003 | Levy et al. ................... 713/400 |
| 2004/0223566 A1 * | 11/2004 | Yamashita .................... 375/354 |
| 2005/0089127 A1 * | 4/2005 | Nagaraja ...................... 375/354 |
| 2006/0184697 A1 * | 8/2006 | Virdi et al. ................... 709/248 |

* cited by examiner

*Primary Examiner*—Nitin C Patel
(74) *Attorney, Agent, or Firm*—Blakely, Sokoloff, Taylor & Zafman LLP

(57) ABSTRACT

Integrated circuits include clock deskew circuitry. The clock deskew circuitry, at the receiver side, receives data signals and a forwarded clock signal from a transmitter. The receiver detects a clock drift in a receiver clock tree, and transmits the detected clock drift to the transmitter. Based on the detected clock drift, the transmitter adjusts the timing of the transmitted signals so that the center of the data eye is aligned with the clock edge at the output of the receiver clock tree.

20 Claims, 5 Drawing Sheets

ELIMINATING RECEIVER CLOCK DRIFT CAUSED BY VOLTAGE AND TEMPERATURE CHANGE IN A HIGH-SPEED I/O SYSTEM THAT USES A FORWARDED CLOCK

BACKGROUND

1. Field

Clock synchronization in microelectronic circuit design.

2. Background

Integrated circuits such as processors, memory devices, and input/output (I/O) devices typically communicate with each other using digital data signals and clock signals. Some systems use a "clock forwarding" technique where a device that sources digital data signals also sources the associated clock signal. The clock signal is then used at the receiving device to time the received data.

FIG. 1 is a block diagram of a simplified prior art system 100 that uses a forwarded clock. System 100 includes integrated circuits 110 and 150 coupled by conducting lines 120 and 122. Only an output interface of circuit 110 and an input interface of circuit 150 are shown. Circuit 110 includes a driver 112 to drive clock signals on line 120 and a driver 114 to drive digital data signals on line 122. Circuit 150 includes input drivers 154, 152 to receive the incoming clock and data signals, respectively. The incoming clock signal, after distributed by a receiver (RX) clock tree 156 is received by a sequential element 158 that includes a plurality of flip-flops. On each clock pulse, sequential element 158 samples the incoming data signals and outputs a data symbol to downstream logic 160 (not drawn to scale). To correctly sample the received data, it is often required that the sampling clock edge be aligned with the center of a data eye pattern within a relatively small range of tolerance.

To ensure the alignment of the clock and data signals, a link training process may be performed after power-on or reset. Typically, a specific data pattern, called a training sequence, is sent from circuit 110 to circuit 150 during the link training. For example, circuit 150 may receive the training sequence, and retransmit the sequence back to circuit 110 using an output interface of circuit 150 and an input interface of circuit 110 not shown in FIG. 1. According to the feedback training sequence, circuit 110 may adjust the phases of its transmitter (TX) clock and data so that these signals are phase matched when received by circuit 150. Additional timing adjustment may be performed to phase match the data with the clock signals at the input of sequential element 158.

However, the received clock at the input of sequential element 158 may drift from the aligned position after the initial training. For example, RX clock tree 156 may be subject to voltage or temperature variations. As a result, propagation delays introduced by RX clock tree 156 may slowly change. Thus, in some conventional systems, a training sequence similar to the one described above is periodically transmitted to ensure the alignment of data and clock signals.

BRIEF DESCRIPTION OF THE DRAWINGS

Embodiments are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Figure 1:
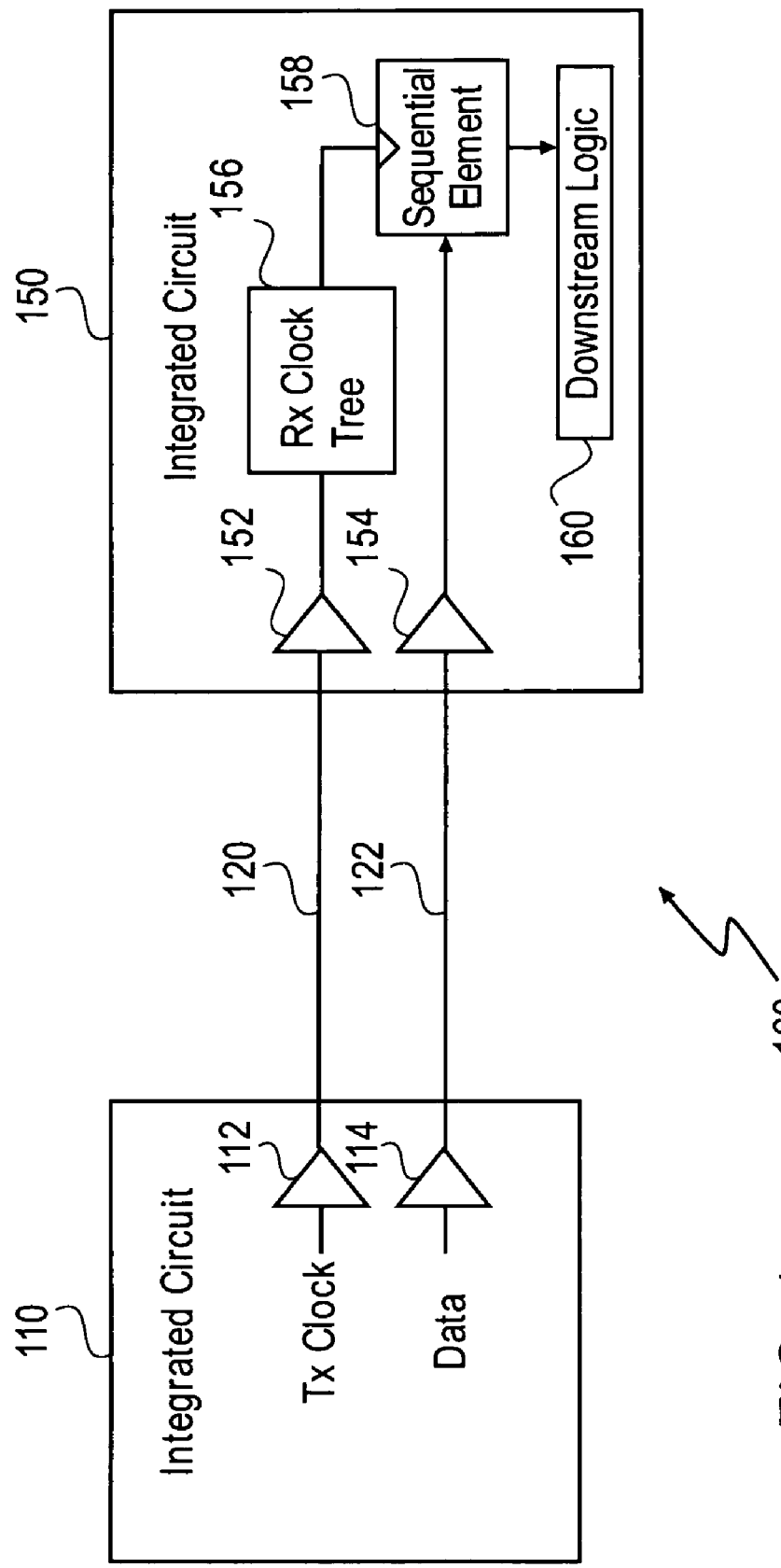
FIG. 1 is a block diagram of prior art integrated circuits that communicate with each other using forwarded clock and data signals.
Figure 2:
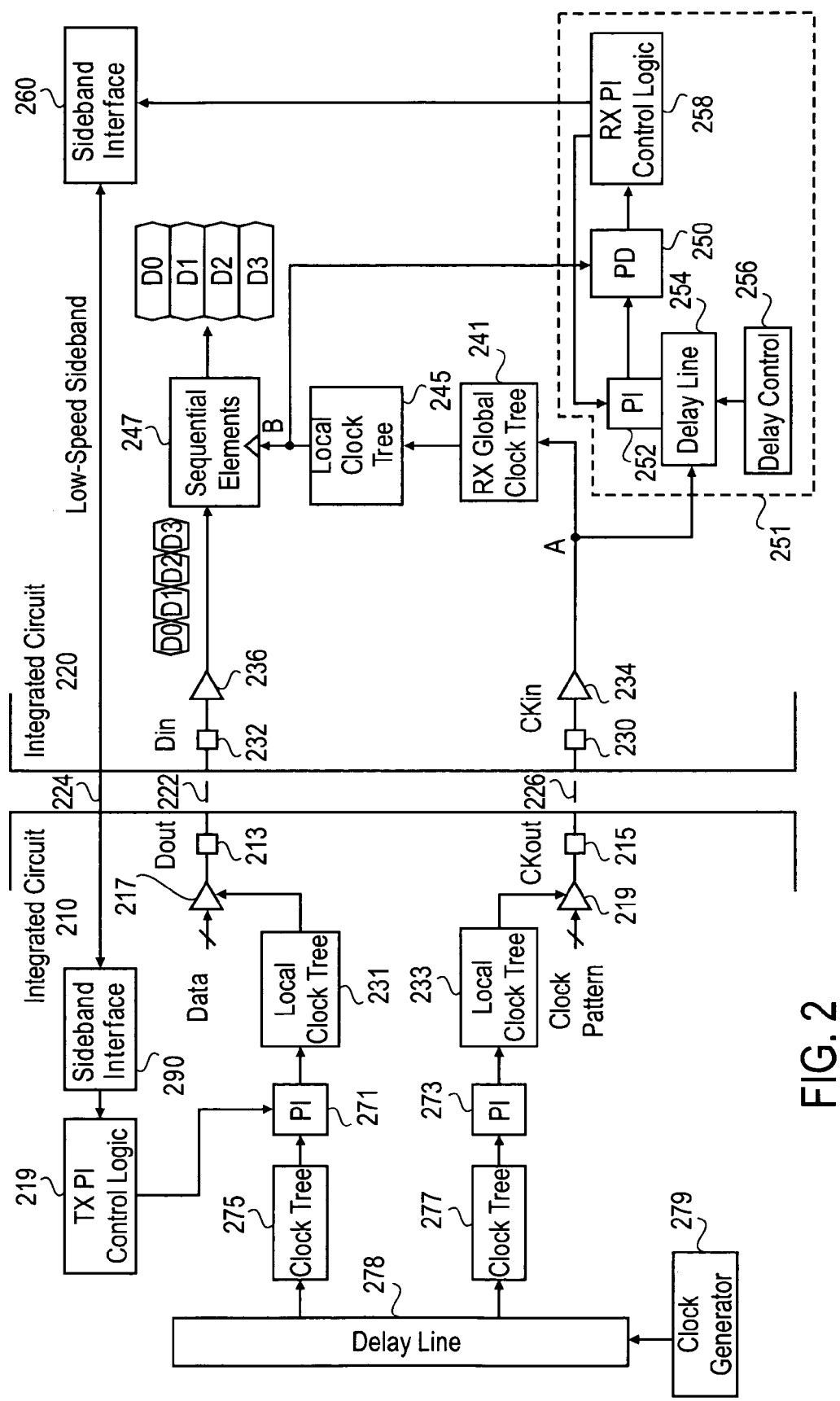
FIG. 2 is a block diagram of an embodiment of integrated circuits that implement a clock deskew technique.

FIG. 2 is a block diagram of a system 200 including integrated circuits 210 and 220 that use a forwarded clock. Circuits 210 and 220 may communicate via data lines 222 (only one line is shown) and a clock line 226 that carries a forwarded clock synchronized with the data signals transmitting on data lines 222. Although data lines 222 are shown as unidirectional, data lines 222 may be bi-directional and another clock line (not shown) may be used to synchronize the data signals transmitting into circuit 210. Thus, circuit 210, as well as circuit 220, may include logic to be both the transmitter and the receiver of data and forwarded clocks.

Between circuits 210 and 220, there may be a low-speed sideband 224 carrying control signals between circuit 220 and circuit 210. At each end of sideband 224 is a sideband interface unit 260 (in circuit 220) or a sideband interface unit 290 (in circuit 210). The sideband may be a one-wire, bi-directional, self-clocked interface. Each sideband interface unit 260, 290 may follow a protocol that allows circuit 210 to write to and read from circuit 220, and vice versa. In some embodiments, additional wires may be used on sideband interface units 260, 290 to simplify the protocol for low-speed data exchange.

In one embodiment, system 200 may be a high-speed system supporting an I/O clock speed above one gigahertz. Circuits 210 and 220 may each reside on a single chip. Circuits 210 and 220 may be any circuit devices that use a forwarded clock. For example, circuits 210 and 220 may be the same type of circuit device exchanging data using forwarded clocks, e.g., memory chips, processors, or network cards. Alternatively, circuits 210 and 220 may be two different types of circuit devices exchanging data using forwarded clocks, e.g., a memory controller and a memory chip, an I/O controller and an I/O device, or a processor and a memory controller. Any of the above mentioned devices may include logic to transmit, receive, or transmit and receive data and forwarded clocks.

Circuit 220 may be used in a high-speed system that uses a forwarded, multi-phase clocking scheme, where one transition on the input clock is received with every group of data. In one embodiment, each group of input data signal may include more than one data symbol for each cycle of the input clock. For example, each group of the input data signal may include four data symbols for each cycle of the input clock. In the descriptions that follow, an embodiment is described that includes four data symbols for each transition on the input clock. However, it is to be understood that the clock deskew technique to be described below may be applied to input data signals including any number of data symbols in each data group.

In one embodiment, circuit 220 may include an I/O interface that includes data input pins (Din) 232, a data input driver 236, a clock input pin (CKin) 230, and a clock input driver 234. Although only one data input pin 232 and data input driver 236 are shown, it is understood that circuit 220 may include a data input pin and a driver for each data bit received in parallel on data lines 222. After received by circuit 220, the input clock signal is distributed to the elements of circuit 220 via a global clock tree 241. The output of global clock tree 241 is fed into a plurality of local clock trees, one for each data input line. These local clock trees adjust the global clock signals to satisfy specific timing requirements of the sequential elements that receive the local clock signals.

In the embodiment as shown, local clock tree 245 translates the one clock transition accompanying every group of four data symbols into four clock transitions with four different phases. The four clock transitions are received by a sequential element 247 to clock the input data signal into four output signals. Sequential element 247 may be any type of element capable of latching data on a clock pulse. For example, sequential element 247 may include four sets of flip-flops, each set being dedicated to latching one of the four data symbols. The output of sequential element 247 may include four parallel lines, each outputting one of the received data symbols at a reduced rate, e.g., a quarter of the input rate as shown. The output data symbols may be aligned as shown or, alternatively, be staggered with each output symbol being delayed by a fixed amount of time from the previous output symbol.

The clock transitions provided by local clock tree 245 may be the rising edge, the falling edge, or a combination of the rising and falling edges of each clock pulse. The transitions may be provided by a full-rate clock signal (on the rising or falling edge), a half-rate clock signal (on both the rising and falling edges), two quarter-rate clock signals (on both the rising and falling edges of two staggered clocks signals, with one clock signal delayed by an input data symbol from the other clock signal), or any other rates that allow each input data symbol to be clocked.

After an initial training to align the data with the clock, the clock may slowly drift due to temperature or voltage variations. To compensate for the clock drift, circuits 210 and 220 implement a clock deskew technique that monitors the clock drift in circuit 220 and adjusts a transmitter (TX) clock in circuit 210 accordingly. Using the clock deskew technique avoids the complexity of periodic link-retraining. Although it is also possible to adjust the received clock whenever the clock drifts, clock compensation at the receiver side often requires a wider delay range and additional phase interpolators in the receiver clock path. The additional circuitry may add a significant amount of jitter to the received clock and degrade the achievable I/O bandwidth.

In one embodiment, circuit 220 includes a phase monitor 251 to monitor the changes in clock phases at an output end of the local clock trees (point B). As mentioned above, circuit 220 may include a plurality of local clock trees, one for each data input line 22. The local clock trees may be matched, meaning that the local clock trees have the same delay structure and the clock paths from point A to their respective outputs have the same delay. If the local clock trees are matched, circuits 220 may include a single phase monitor for all of input data lines 222. In alternative embodiment where the local clock trees are not matched, circuit 220 may include a separate phase monitor for each of input data lines 222 to independently monitor the clock drift on each data line.

In one embodiment, phase monitor 251 includes a phase interpolator (PI) 252, a phase detector 250, and a receiver (RX) PI control logic 258. PI 252 is coupled to a delay line 254. A delay control unit 256 coupled to delayed line 254 controls the accuracy of the delay with respect to the clock period (T). Delay control 256 may be implemented by a Phase Locked-Loop (PLL) that uses a low-frequency off-chip reference clock, or a Delay-Locked Loop (DLL) that uses the forwarded clock as a reference.

In one embodiment, delay line 254 may receive the forwarded clock signal at an input end of RX global clock tree 241 (point A) and produces multiple delayed clocks of different phases. For example, delay line 254 may produce two or more, delayed clock signals having a substantially fixed phase difference, such as a 45° or 90° between clock phases. Based on a PI control signal generated by RX PI control logic 258, PI 252 selects two of the delayed clock signals from delay line 254 and interpolates in phase between them to produce a PI output signal.

Phase detector 250 compares the phases of the PI output signal and the output of local clock tree 245 (point B), and outputs a "1" or a "0" as a leading or lagging indicator. RX PI control logic 258 may increase or decrement the configuration setting of PI 252 using the PI control signal until the output of phase detector 250 toggles between "0" and "1." The toggling indicates that the phase difference at phase detector 250 is substantially zero.

RX PI control logic 258 may output a PI difference to sideband interface unit 260. The PI difference may be the difference between the current PI configuration setting and the PI setting after the initial deskew training. Sideband interface unit 260 of circuit 220 and sideband interface unit 290 may follow a protocol that allows information to be exchanged between circuits 210 and 220. Circuit 210 may obtain a PI difference for each of PIs in the RX phase monitors if multiple phase monitors are used.

To transmit data signals to circuit 220, circuit 210 may include an I/O interface that includes data output pins (Dout) 213 (only one is shown), an output data driver 217 associated with each data output pin 213 for transmitting data to data lines 222. It is to be understood that circuit 210 may include a data output pin and a driver for each of the data bits transmitted in parallel on data lines 222. Circuit 210 also includes a clock output pin (Ckout) 215 and a clock output driver 219 connecting to a TX clock pattern. Data output driver 217 and clock output driver 219 drive output signals on each clock pulse generated by local clock trees 231 and 233. Although only one local clock tree is shown in connection with the outgoing data, it is to be understood that each output data line is coupled to a separate local clock tree. Thus, the clock phases of local clock trees 231 and 233 determine the phases of outgoing data signals and clock signals.

The clock phases of local clock trees 231 and 233 are controlled by data PIs 271 and clock PI 273, respectively. Each PI 271, 273 receives input from a respective clock tree 275, 277, which in turn receives input from a delay line 278 clocked by a clock generator 279 which may be implemented by a PLL. Clock tree 275, 277 may directly connect to a PLL that outputs multiple phases so delay line 278 may be eliminated. PIs 271 and 273 interpolate clock phases according to their respective PI control signals generated by TX PI control logic 219. When TX PI control logic 219 receives the difference in PI configuration settings from sideband interface unit 260, TX PI control logic 219 computes one or more new configuration setting for one of more the TX PIs. In an embodiment where the RX local clock trees are matched and a single phase monitor is used in circuit 220, TX PI control logic 219 may compute a configuration setting for all of the data PIs 271 or a configuration setting for clock PI 273. In another embodiment where the RX local clock trees are unmatched and a plurality of phase monitors are used in circuit 220, TX PI control logic 219 may compute a configuration setting for PI controlling the timing of the data line that experiences clock drift.

In one embodiment, the difference in configuration settings from circuit 220 may include the number of phase steps adjusted by RX PI control logic 258. TX PI control logic 219 may translate the received phase steps into phase steps that PI 271 should adjust. As the resolution for the PIs of circuit 220 may differ from the PIs of circuit 210, TX PI control logic 219 may store the step resolution of PI 252 in an internal storage to ensure correct computation of the phase steps for PI 271. If the resolution of the TX PIs and the RX PIs are different, in one embodiment, the amount of phase adjustment made by the TX PIs may be a close approximation of the actual clock drift such that phase differences detected by phase monitor 251 is substantially zero.

Figure 3A:
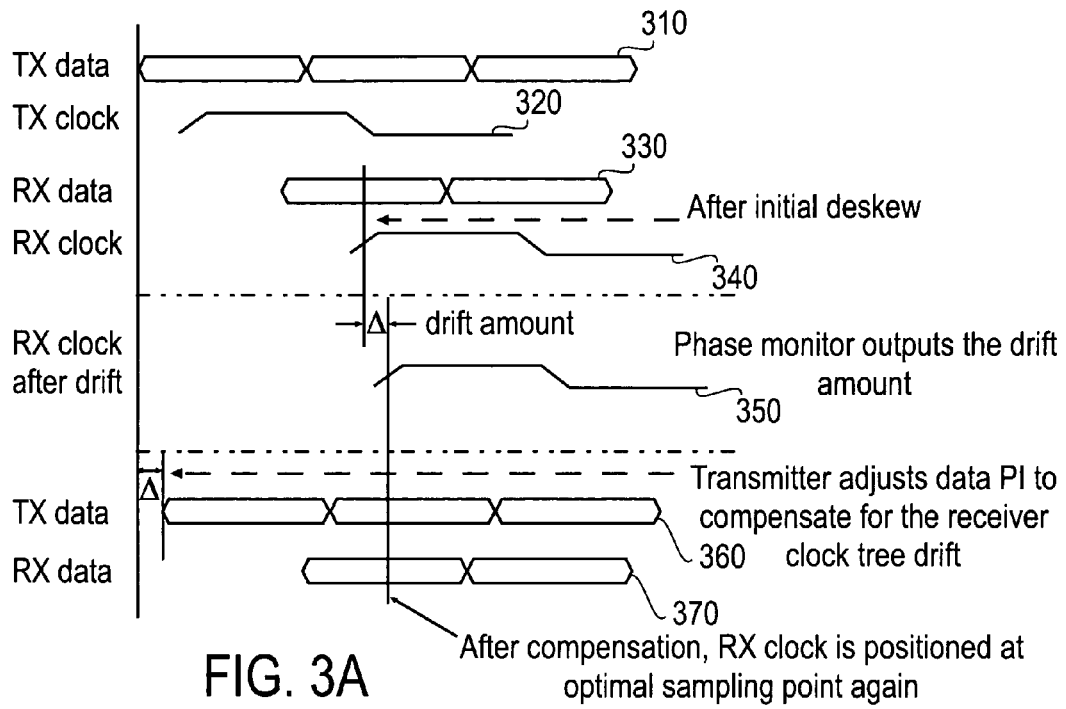
FIG. 3A and FIG. 3B are timing diagrams showing two examples of the clock deskew technique implemented by the integrated circuits of FIG. 2.
Figure 3B:
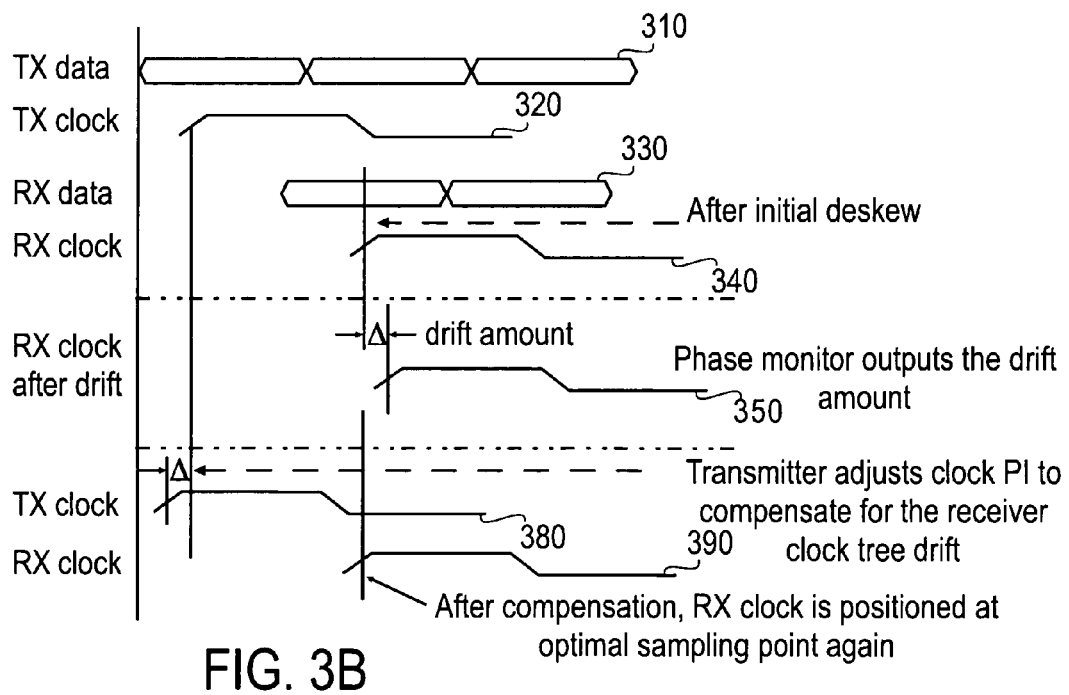

FIG. 3A and FIG. 3B illustrate two examples of the clock deskew technique described above. The horizontal axis represents time; the vertical axis represents the signal levels of different signal traces. In FIG. 3A, traces 310, 320, 330, and 340 represent data and clock signals after initial deskew as a result of link training, where the RX clock edge (trace 340) is aligned with the center of the RX data eye (trace 330). The TX clock edge (trace 320) is slightly ahead the center of the TX data eye (trace 310) to compensate for the additional delay caused by RX clock trees experienced by the clock signals.

When the output of the RX clock tree (point B) starts to drift (trace 350), the amount of drift ($\Delta$) is transmitted back to the transmitter. The transmitter adjusts the TX data signals (trace 360) to match the amount of clock drift at the receiver. In the example as shown in FIG. 3A, the transmitter delays the TX data signals (trace 360) by $\Delta$ (or an approximation thereof) to compensate for the clock drift. After the compensation, the RX clock edge (trace 350) is re-aligned with the center of the RX data eye (trace 370). In an alternative embodiment shown in FIG. 3B, the transmitter may advance the TX clock signals (trace 380) by $\Delta$ (or an approximation thereof) to compensate for the clock drift. After the compensation, the RX clock edge (trace 390) is re-aligned with the center of the RX data eye (trace 330).

Figure 4:
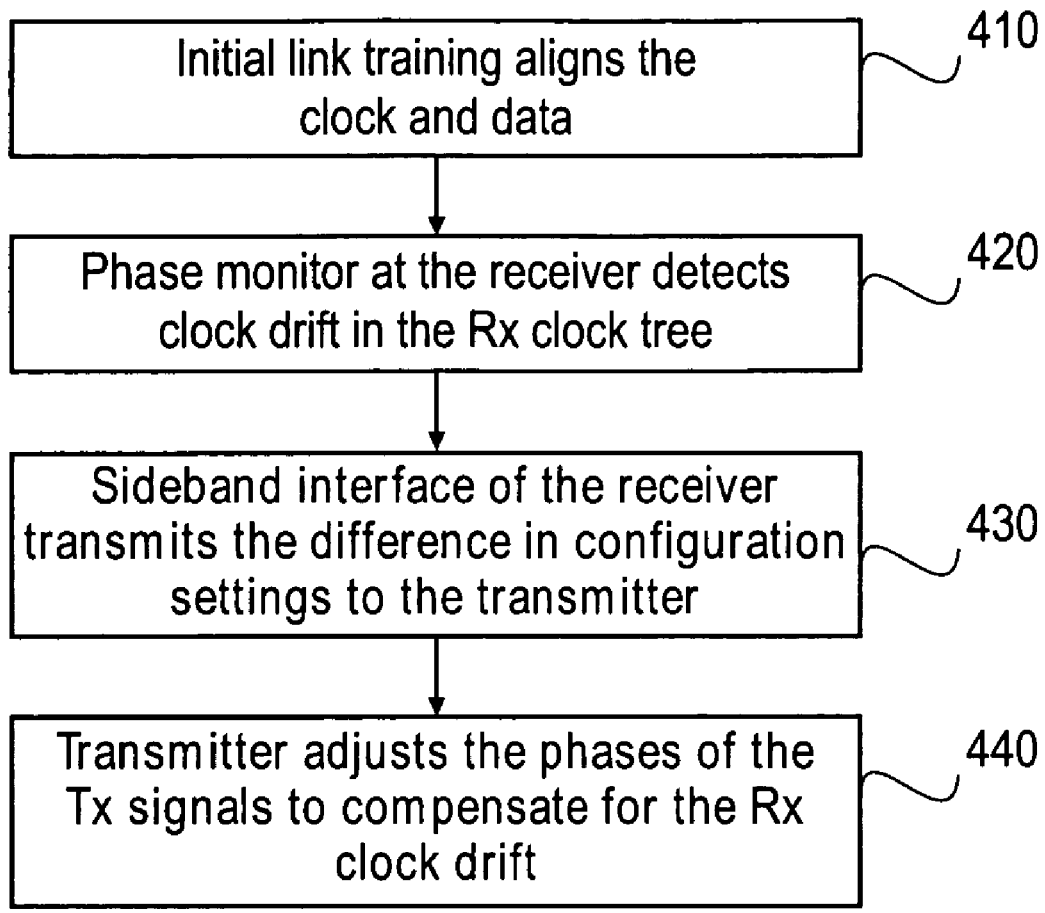
FIG. 4 is a flowchart showing an example of the operations performed by the integrated circuits of FIG. 2.

FIG. 4 is flowchart showing an embodiment of the clock deskew technique. Referring also to FIG. 2, at block 410, initial link training is performed to align the RX clock edge with the center of the RX data eye. At block 420, phase monitor 251 at the receiver (circuit 220) detects clock drift in RX clock trees 241 and 245. At block 430, sideband interface unit 260 of the receiver transmits the difference in configuration settings to the transmitter (circuit 210) via sideband 224. In one embodiment, the difference in configuration settings may be in the form of phase steps adjusted by a PI of the receiver. At block 440, the transmitter adjusts the phases of the transmitted signals (data signals or clock signals) to compensate for the RX clock drift. As a result, the RX clock drift may be compensated and the phase mismatch at the input of sequential element 247 (point B) may be substantially zero.

Figure 5:
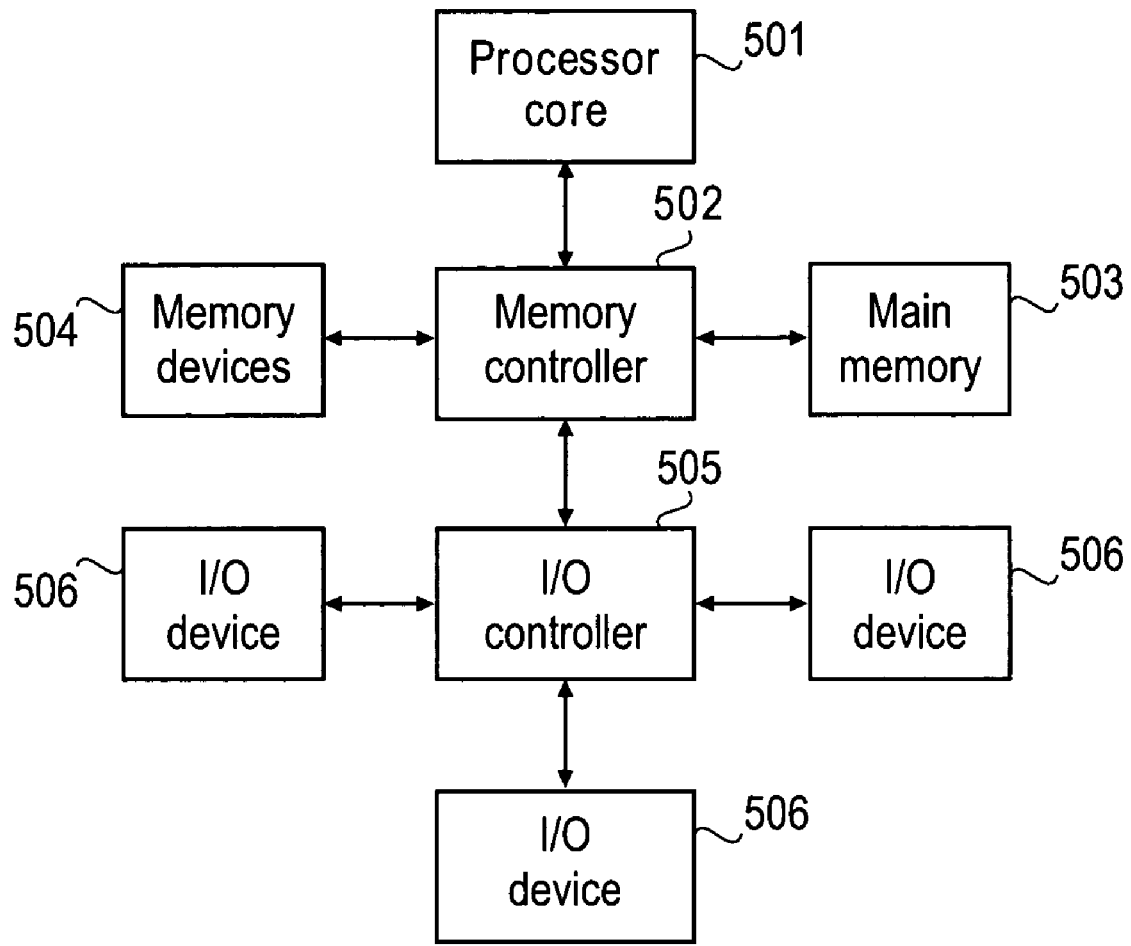
FIG. 5 is a block diagram of a computing system including computing devices that use the clock deskew technique.

FIG. 5 is a block diagram of an embodiment of a computing system 500 that includes a processor core 501, a memory controller 502 coupled to a main memory 503 and other memory devices 504. In an alternative embodiment, memory controller 502 may reside on the same chip as processor core 501. Main memory 503 may comprise one or more types of memory such as, for example, dynamic random access memory (DRAM) devices, synchronous dynamic random access memory (SDRAM) devices, double data rate (DDR) SDRAM devices, or other volatile memory devices. Other memory devices 504 may comprise flash memory, graphics cards, read-only memory (ROM), or any volatile or non-volatile memory devices.

Computing system 500 may further comprise an I/O controller 550 coupled to memory controller 502. I/O controller 505 provides an interface for CPU 501 and other components of system 500 to access to one or more I/O devices 506. I/O devices 506 may include Industry Standard Architecture (ISA) devices, Peripheral Component Interconnect (PCI) devices, PCI Express devices, Universal Serial Bus (USB) devices, Small Computer System Interface (SCSI) devices, or other standard or proprietary I/O devices suitable for server or general applications.

Any pair of devices 501-506 that are directly connected (e.g., 502 and 503, 505 and 506, 501 and 502) may implement the clock deskew technique described above. Integrated circuits residing within any of devices 501-506 may also implement the clock deskew technique. For example, some of the devices 501-506 (e.g., main memory 503) may include two integrated circuits (e.g., memory chips) that exchange data using forwarded clocks and may thus utilize the clock deskew technique. The device pair may be connected by a wire line or a wireless link that has a point to point connection. Each device 510-560, or the integrated circuits thereof, may include a receiver interface that monitors the RX clock drift for incoming data and/or a transmitter interface that compensates the phase differences for outgoing data. For example, main memory 530 may include phase monitor 251 of FIG. 2 at its input and TX PI control logic 219 at its output. Thus, phase mismatches between clock signals and the bi-directional data signals may be eliminated.

Other systems that may use the clock deskew technique may include desktop/laptop computers, servers, cellular phones, personal digital assistants, local area network interfaces, network bridges or routers, or any other suitable wired or wireless systems.

In the foregoing specification, specific embodiments have been described. It will, however, be evident that various modifications and changes can be made thereto without departing from the broader spirit and scope of the appended claims. The specification and drawings are, accordingly, to be regarded in an illustrative rather than a restrictive sense.

What is claimed is:

1. A method comprising:
    receiving data signals and a forwarded clock at a receiver interface;
    detecting a clock drift in a receiver clock tree by comparing phases of two points in the receiver interface, a first point being an input end of the receiver clock tree and a second point located between an output end of the receiver clock tree and an input of a data latching element that latches the data signals;
    transmitting the detected clock drift to a transmitter of both the data signals and the forward clock; and
    adjusting timing of transmitted signals at the transmitter based on the detected clock drift.

2. The method of claim 1 wherein adjusting timing of transmitted signals at the transmitter comprises:
    adjusting a transmitter phase interpolator for a data line carrying the data signals.

3. The method of claim 1 wherein adjusting timing of transmitted signals at the transmitter comprises:
    adjusting a transmitter phase interpolator for a clock line that carries the forwarded clock.

4. The method of claim 1 wherein detecting a clock drift comprises:
    detecting a phase difference between an input end and an output end of the receiver clock tree.

5. The method of claim 1 wherein detecting a clock drift comprises:

comparing a phase at an output of a receiver phase interpolator with the phase of the second point to produce an indicator; and according to the indicator, adjusting a configuration setting of the receiver phase interpolator at a receiver of the forwarded clock until the indicator toggles.

6. The method of claim 5 further comprising:

transmitting a number of phase steps by which the receiver phase interpolator adjusts; and translating the number of phase steps into a configuration setting for a transmitter phase interpolator.

7. The method of claim 1 wherein transmitting the detected clock drift comprises:

transmitting the detected clock drift on a feedback path separate from signal lines that carry the data signals and the forwarded clock.

8. An apparatus comprising:

a receiver interface to receive data signals and a forwarded clock, the receiver interface including:
   a receiver clock tree;
   a data latching element to latch the data signals; and
   a phase monitor to compare phases of two points in the receiver interface, a first point being an input end of the receiver clock tree and a second point located between an output end of the receiver clock tree and an input of the data latching element; and a transmitter interface to transmit the data signals and the forwarded clock, the transmitter interface including:
   transmitter control logic to adjust timing of transmitted signals based on the detected clock drift.

9. The apparatus of claim 8 wherein the transmitter interface further comprises:

a plurality of transmitter phase interpolators to receive input from the transmitter control logic and to adjust phases of the data signals.

10. The apparatus of claim 8 wherein the transmitter interface further comprises:

a transmitter phase interpolator for the forwarded clock to receive input from the transmitter control logic and to adjust phases of the forwarded clock.

11. The apparatus of claim 8 wherein the phase monitor comprises:

a phase detector to detect a phase difference between an input end and an output end of the receiver clock tree.

12. The apparatus of claim 8 wherein the phase monitor further comprises:

a receiver phase interpolator to match phases of an input end to an output end of the receiver clock tree.

13. The apparatus of claim 12 wherein the receiver interface further comprises:

a sideband interface to transmit a number of phase steps by which the receiver phase interpolator adjusts.

14. The apparatus of claim 8 further comprising:

a feedback path coupled to the receiver interface and the transmitter interface to transmit the detected clock drift to the transmitter interface, the feedback path being separate from signal lines that carry the data signals and the forwarded clock.

15. A system comprising:

a first device to receive data signals and a forwarded clock, the first device including:
   a receiver clock tree;
   a data latching element to latch the data signals; and
   a phase monitor to compare phases of two points in the receiver interface, a first point being an input end of the receiver clock tree and a second point located between an output end of the receiver clock tree and an input of the data latching element, the phase monitor to detect a clock drift in the receiver clock tree based on a comparison result of the phases;

a second device coupled to the first device to transmit the data signals and the forwarded clock, the second device including:
   transmitter control logic to adjust timing of transmitted signals based on the detected clock drift; and conducting wires connecting the first device to the second device to carry the data signals and the forwarded clock.

16. The system of claim 15 wherein the second device further comprises:

a plurality of transmitter phase interpolators coupled to the transmitter control logic to adjust phases of the transmitted signals.

17. The system of claim 15 wherein the phase monitor comprises:

a phase detector to detect a phase difference between an input end and an output end of the receiver clock tree.

18. The system of claim 15 wherein the phase monitor further comprises:

a receiver phase interpolator to match phases of an input end to an output end of the receiver clock tree.

19. The system of claim 18 wherein the first device further comprises:

a sideband interface to transmit a number of phase steps by which the receiver phase interpolator adjusts.

20. The system of claim 15 further comprising:

a feedback path coupled to the first device and the second device to transmit the detected clock drift to the second device, the feedback path being separate from the conducting wires that carry the data signals and the forwarded clock.

* * * * *